US012588299B2

(12) United States Patent
Taguchi et al.

(10) Patent No.: US 12,588,299 B2
(45) Date of Patent: Mar. 24, 2026

(54) SEMICONDUCTOR LIGHT RECEPTION ELEMENT

(71) Applicant: HAMAMATSU PHOTONICS K.K., Hamamatsu (JP)

(72) Inventors: Keiki Taguchi, Hamamatsu (JP); Hajime Ishihara, Hamamatsu (JP); Yoshiaki Ohshige, Hamamatsu (JP); Kenji Makino, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 344 days.

(21) Appl. No.: 18/039,502

(22) PCT Filed: Nov. 15, 2021

(86) PCT No.: PCT/JP2021/041898
§ 371 (c)(1),
(2) Date: May 31, 2023

(87) PCT Pub. No.: WO2022/118643
PCT Pub. Date: Jun. 9, 2022

(65) Prior Publication Data
US 2023/0420595 A1 Dec. 28, 2023

(30) Foreign Application Priority Data
Dec. 4, 2020 (JP) ................................. 2020-201986

(51) Int. Cl.
*H10F 30/22* (2025.01)
*H10F 77/124* (2025.01)
*H10F 77/20* (2025.01)
(52) U.S. Cl.
CPC ......... *H10F 30/22* (2025.01); *H10F 77/1243* (2025.01); *H10F 77/206* (2025.01)

(58) Field of Classification Search
CPC ............................... H10F 30/22; H10F 77/206
See application file for complete search history.

(56) References Cited

U.S. PATENT DOCUMENTS

| 5,471,076 A | 11/1995 | Murakami et al. |
| 2009/0189207 A1 | 7/2009 | Dutta |
| 2011/0254052 A1 | 10/2011 | Kouvetakis et al. |

FOREIGN PATENT DOCUMENTS

| EP | 0347157 A2 * | 12/1989 |
| EP | 0388161 A2 | 9/1990 |
(Continued)

OTHER PUBLICATIONS

International Preliminary Report on Patentability mailed Jun. 15, 2023 for PCT/JP2021/041898.
(Continued)

*Primary Examiner* — Matthew L Reames
(74) *Attorney, Agent, or Firm* — Faegre Drinker Biddle & Reath LLP

(57) ABSTRACT

A semiconductor light receiving element includes: a substrate; a semiconductor stacked portion that is formed on a first region of the substrate; and a first electrode and a second electrode that are electrically connected to the semiconductor stacked portion. Te semiconductor stacked portion includes: a light absorption layer of a first conductivity type including $In_xGa_{1-x}As$; and a second region of a second conductivity type other than the first conductivity type that is located on the opposite side to the substrate with respect to the light absorption layer and bonded to the light absorption layer. The first electrode is connected to a first portion of the first conductivity type located on the substrate side with respect to the light absorption layer in the semiconductor stacked portion.

15 Claims, 7 Drawing Sheets

(56)                    References Cited

FOREIGN PATENT DOCUMENTS

| JP | H6-216403 A | 8/1994 |
|----|-------------|--------|
| JP | H9-283786 A | 10/1997 |
| JP | 2002-064217 A | 2/2002 |
| JP | 2002-373999 A | 12/2002 |
| JP | 2008-205001 A | 9/2008 |
| JP | 2009-117499 A | 5/2009 |
| JP | 2015-211166 A | 11/2015 |
| JP | 2017-034028 A | 2/2017 |
| JP | 2019-197794 A | 11/2019 |

OTHER PUBLICATIONS

Joshi A et al, "High-Speed Low-Noise p-i-n InGaAs Photoreceiver at 2-μm Wavelength", IEEE Photonics Technology Letters, IEEE, USA, vol. 2 0, No. 8, Apr. 15, 2008, p. 551-p. 553, XP011206011.

* cited by examiner

SEMICONDUCTOR LIGHT RECEPTION ELEMENT

TECHNICAL FIELD

The present disclosure relates to a semiconductor light receiving element.

BACKGROUND ART

Patent Literature 1 describes a photodiode. This photodiode includes a slope reflecting portion formed on an InP substrate, a p electrode, a diffraction lattice, a light reception portion including an InGaAs light absorption layer, and an n electrode. Light incident perpendicularly from a surface is totally reflected by the slope reflecting portion, an optical path thereof is changed to an obliquely upward direction, and the light is incident on the light absorption layer in the light reception portion from obliquely downward. The obliquely incident light propagates in the light absorption layer, is reflected in a reverse direction of the incidence direction by the diffraction lattice and the p electrode provided on the light reception portion, and is absorbed by the light absorption layer again.

CITATION LIST

Patent Literature

[Patent Literature 1] Japanese Unexamined Patent Publication No. 2009-117499

SUMMARY OF INVENTION

Technical Problem

In the aforementioned technical field, there is demand for further increase in an operating speed. For this purpose, it is conceivable that a moving distance of electrons be decreased by decreasing the thickness of the light absorption layer. However, a decrease in sensitivity is caused when the thickness of the light absorption layer is decreased. On the other hand, in the photodiode described in Patent Literature 1, the effective thickness of the light absorption layer is increased by causing light to propagate along an optical path in an oblique direction with respect to the light absorption layer. Accordingly, it is considered that the decrease in sensitivity due to the decrease in thickness of the light absorption layer is curbed and an increase in speed is achieved.

However, in the photodiode described in Patent Literature 1, there is concern about an increase in cost because machining for forming the slope reflecting portion on the substrate needs to be performed to form an oblique optical path with respect to the light absorption layer, or the like.

An objective of the present disclosure is to provide a semiconductor light receiving element that can curb an increase in cost and achieve an increase in speed.

Solution to Problem

According to an aspect of the present disclosure, there is provided a semiconductor light receiving element that receives incidence of light in at least one wavelength band of a 1.3 μm band, a 1.55 μm band, and a 1.6 μm band and generates an electrical signal according to incident light, the semiconductor light receiving element including: a substrate; a semiconductor stacked portion that is formed on a first region of the substrate; and a first electrode and a second electrode that are electrically connected to the semiconductor stacked portion, wherein the semiconductor stacked portion includes: a light absorption layer of a first conductivity type including $In_xGa_{1-x}As$; a buffer layer of the first conductivity type disposed between the substrate and the light absorption layer; and a second region of a second conductivity type other than the first conductivity type that is located on the opposite side to the substrate with respect to the light absorption layer and bonded to the light absorption layer, wherein the first electrode is connected to a first portion of the first conductivity type located on the substrate side with respect to the light absorption layer in the semiconductor stacked portion, wherein the second electrode is connected to a second portion of the second conductivity type located on the opposite side to the substrate with respect to the light absorption layer in the semiconductor stacked portion, wherein an In content x in the light absorption layer is equal to or greater than 0.55, and wherein a thickness of the light absorption layer is equal to or less than 1.8 μm.

The semiconductor light receiving element handles light in wavelength bands for optical communication such as the 1.3 μm band (O-band (Original-band)), 1.55 μm band (C-band (Conventional-band)), and 1.6 μm band (L-band (Long-wavelength-band)). In the semiconductor light receiving element, the light absorption layer provided on the substrate includes $In_xGa_{1-x}As$. The In content x in the light absorption layer is equal to or greater than 0.55 (and less than 1). In this way, when the In content x of $In_xGa_{1-x}As$ in the light absorption layer is equal to or greater than 0.55, an absorption coefficient is improved, for example, in comparison with a case in which the In content x is 0.53 (for example, the absorption coefficient is improved two times by setting the content x to 0.62 in the 1.55 μm band). Accordingly, it is possible to avoid a decrease in sensitivity even when the thickness of the light absorption layer is decreased to 1.8 μm or less. That is, it is possible to achieve an increase in speed. In the semiconductor light receiving element, a particular element (for example, the slope reflecting portion of the photodiode described in Patent Literature 1) does not need to be formed at the time of achievement of an increase in speed. Accordingly, with the semiconductor light receiving element, it is possible to curb an increase in cost and to achieve an increase in speed.

In the semiconductor light receiving element according to the present disclosure, the buffer layer may include a strain relaxation layer having a lattice constant between a lattice constant of the substrate and a lattice constant of the light absorption layer. In this case, it is possible to improve crystallinity of the semiconductor stacked portion.

In the semiconductor light receiving element according to the present disclosure, the buffer layer may include a plurality of strain relaxation layers that are disposed such that the lattice constant become close to the lattice constant of the light absorption layer in a stepwise manner from the substrate to the light absorption layer. Alternatively, the buffer layer may include the strain relaxation layer in which the lattice constant changes continuously to become close to the lattice constant of the light absorption layer from the substrate to the light absorption layer. In this case, it is possible to reliably improve crystallinity of the semiconductor stacked portion.

In the semiconductor light receiving element according to the present disclosure, the semiconductor stacked portion may include: a cap layer of the first conductivity type that is provided on the light absorption layer on the opposite side to the substrate with respect to the light absorption layer and includes InAsP; and a contact layer of the first conductivity type that is provided on the cap layer on the opposite side to the substrate with respect to the light absorption layer and includes InGaAs. The second region may be formed from the contact layer to the light absorption layer via the cap layer, and the second portion to which the second electrode is connected may be a surface of the second region formed in the contact layer. In this case, it is possible to decrease contact resistance of the second electrode.

In the semiconductor light receiving element according to the present disclosure, the semiconductor stacked portion may include: a first semiconductor layer of the first conductivity type disposed between the substrate and the light absorption layer; and a second semiconductor layer of the first conductivity type including an impurity concentration lower than an impurity concentration of the first semiconductor layer and disposed between the first semiconductor layer and the light absorption layer. In this case, it is possible to achieve a further increase in speed through a decrease in capacitance.

In the semiconductor light receiving element according to the present disclosure, the semiconductor stacked portion may include a third semiconductor layer disposed between the light absorption layer and the cap layer and having a band gap between a band gap of the light absorption layer and a band gap of the cap layer. In this case, it is possible to curb difficulty in taking out carriers which is due to rapidly changing the band gap between the cap layer and the light absorption layer.

In the semiconductor light receiving element according to the present disclosure, at least one layer of the buffer layer may be semi-insulated by being doped with Fe. In this case, it is possible to improve crystallinity.

In the semiconductor light receiving element according to the present disclosure, the In content x in the light absorption layer may be equal to or greater than 0.57, and the thickness of the light absorption layer may be equal to or less than 1.2 μm. In addition, the In content x in the light absorption layer may be equal to or greater than 0.59, and the thickness of the light absorption layer may be equal to or less than 0.7 μm. In this case, it is possible to achieve an increase in speed due to a further decrease in thickness of the light absorption layer.

In the semiconductor light receiving element according to the present disclosure, the substrate may include a semi-insulated semiconductor. In this case, it is possible to achieve a decrease in capacitance.

In the semiconductor light receiving element according to the present disclosure, the substrate may include an insulator or a semi-insulated semiconductor, and the semiconductor stacked portion may be directly bonded to the substrate. In this way, by separately forming the substrate and the semiconductor stacked portion and directly bonding them to construct the semiconductor light receiving element, it is possible to achieve an increase in diameter and to curb an increase in cost by forming optical components out of cheap materials.

Advantageous Effects of Invention

According to the present disclosure, it is possible to provide a semiconductor light receiving element that can curb an increase in cost and achieve an increase in speed.

BRIEF DESCRIPTION OF DRAWINGS

FIG. 3 is a sectional view taken along line III-III in FIG. 2.

DESCRIPTION OF EMBODIMENTS

Figure 1:
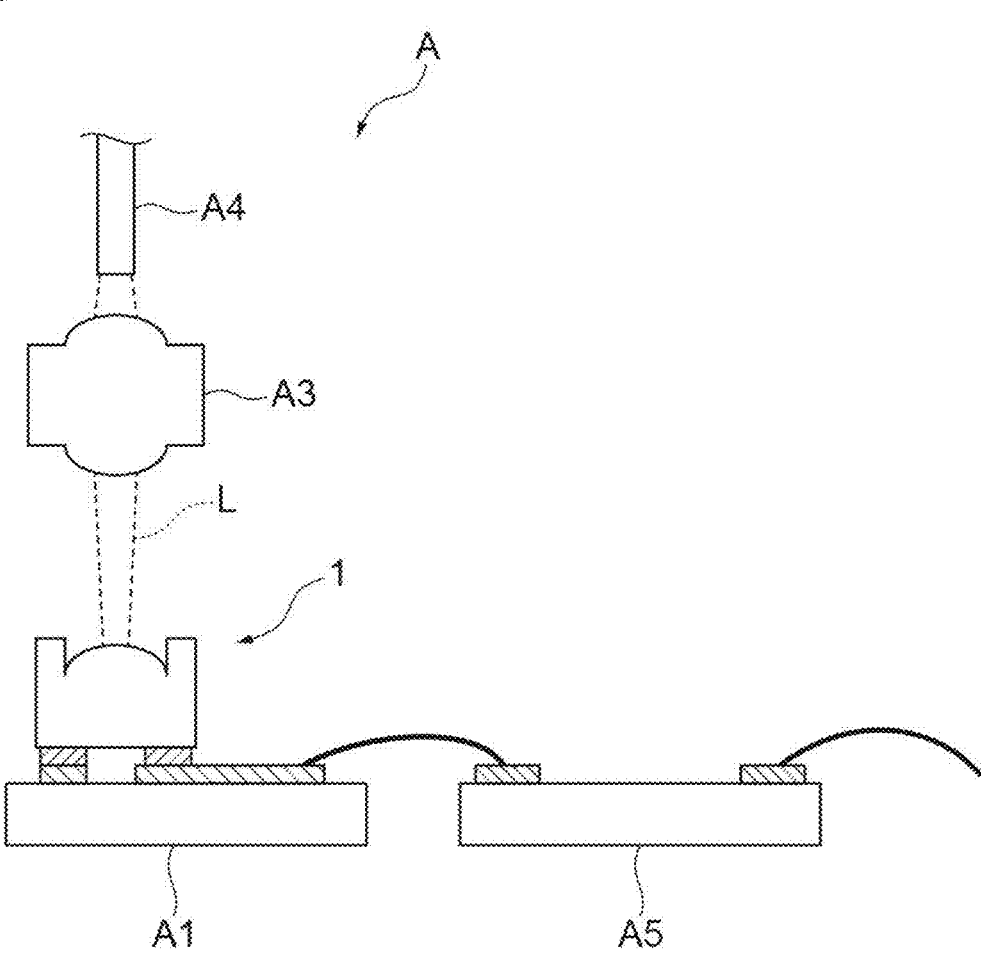
FIG. 1 is a schematic side view illustrating a laser device according to an embodiment.

Hereinafter, an embodiment will be described in detail with reference to the accompanying drawings. In the drawings, the same or corresponding elements will be referred to by the same reference signs, and repeated description thereof may be omitted.

FIG. 1 is a schematic side view illustrating an optical device according to an embodiment. As illustrated in FIG. 1, an optical device A includes a semiconductor light receiving element 1. The optical device A handles light in wavelength bands for optical communication such as a 1.3 μm band (O-band (Original-band)), a 1.55 μm band (C-band (Conventional-band)), and a 1.6 μm band (L-band (Long-wavelength-band)), converts the light to an electrical signal, and outputs the electrical signal. The 1.3 μm band is, for example, a wavelength range of 1.26 μm to 1.36 μm. The 1.55 μm band is, for example, a wavelength range of 1.53 μm to 1.565 μm. The 1.6 μm band is, for example, a wavelength range which is greater than 1.565 μm and equal to or less than 1.625 μm. The light in wavelength bands for communication is light having a peak in one wavelength band of the aforementioned wavelength bands (that is, a wavelength other than the peak may be located outside of the wavelength range of the wavelength bands).

Accordingly, the semiconductor light receiving element 1 also handles the light in the wavelength bands and serves to receive incidence of light L of a wavelength belonging to at least one wavelength band of the aforementioned wavelength bands and to generate an electrical signal according to the incident light. The semiconductor light receiving element 1 is mounted on a sub-mount A1. The light L is guided by an optical fiber A4 and is condensed on a light reception portion of the semiconductor light receiving element 1 by a lens A3.

The electrical signal generated by the semiconductor light receiving element 1 is input to a trans-impedance amplifier (TIA) A5 via an electrode pad (which is schematically hatched in FIG. 1 or the like) provided on the sub-mount A1 and a wire, is converted to a voltage by the trans-impedance amplifier A5, and is output to the outside. Here, the semiconductor light receiving element 1 is mounted on the sub-mount A1 in a state in which a rear surface 10b of a substrate 10 which will be described later faces the lens A3 and the optical fiber A4. That is, the semiconductor light receiving element 1 is used as a rear surface incidence type.

Figure 2:
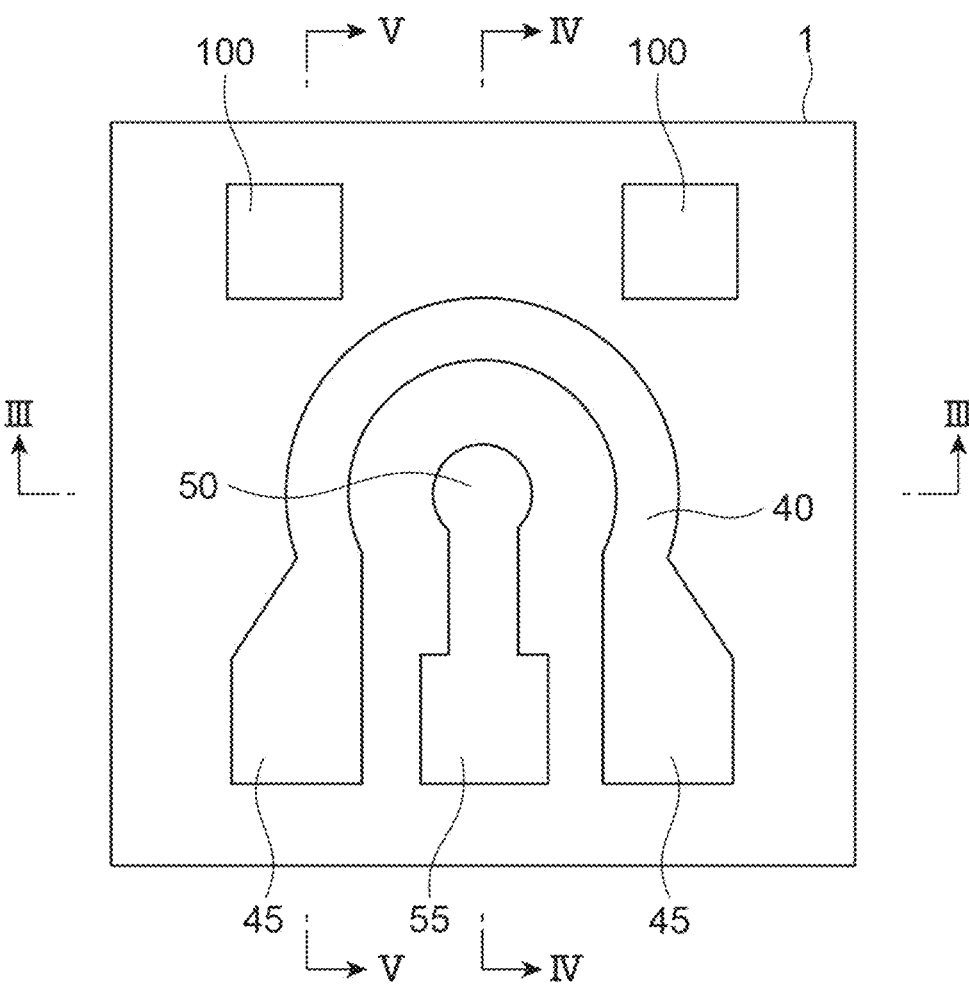
FIG. 2 is a plan view of a semiconductor light receiving element illustrated in FIG. 1.
Figure 3:
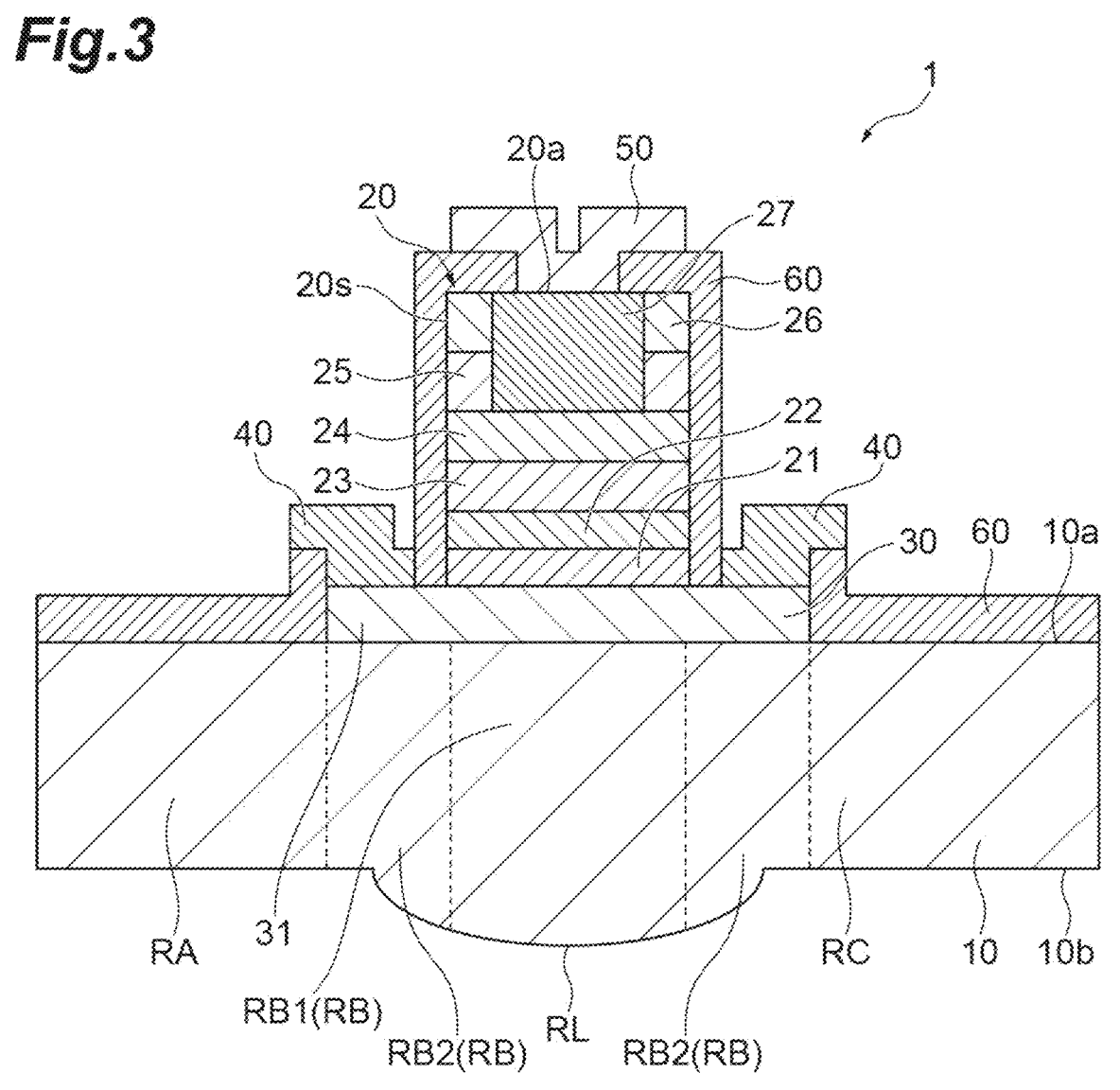

FIG. 2 is a plan view of the semiconductor light receiving element illustrated in FIG. 1. FIG. 3 is a sectional view taken along line III-III in FIG. 2. As illustrated in FIGS. 2 and 3, the semiconductor light receiving element 1 includes a substrate 10, a semiconductor stacked portion 20, a first electrode 40 (a cathode herein), and a second electrode 50 (an anode herein).

The substrate 10 includes a semi-insulated semiconductor. Here, the substrate 10 is, for example, a semi-insulated semiconductor substrate formed of InP. The substrate 10 includes a front surface 10a and a rear surface 10b opposite to the front surface 10a. The substrate 10 includes a region RA, a region RB (a first region), and a region RC which are sequentially arranged along the front surface 10a and the rear surface 10b. The region RB is a region between the region RA and the region RC and is a region on which the semiconductor stacked portion is provided. More specifically, the region RB includes a central region RB1 and regions RB2 located on two sides (the regions RA and RC sides) of the region RB1. Here, the rear surface 10b of the substrate 10 is an incidence surface of light L, and a lens RL for condensing light L is formed thereon. The lens RL is formed centered on the region RB1 to overlap partially the regions RB2.

The semiconductor stacked portion 20 is formed on the region RB of the substrate 10 as described above and is a semiconductor mesa protruding from the front surface 10a. The semiconductor stacked portion 20 includes a buffer layer 30 of a first conductivity type (an N type herein, for example, N$^+$ type). The buffer layer 30 is provided centered on the region RB1 to overlap partially the regions RB2. Here, the semiconductor stacked portion 20 is in contact with the front surface 10a of the substrate 10 in the buffer layer 30.

Layers of the semiconductor stacked portion 20 other than the buffer layer 30 are provided in a part overlapping the region RB1 in the buffer layer 30 in a view seen in a direction crossing the front surface 10a. The buffer layer 30 includes a first portion 31 exposed from another layer (and a passivation film 60 which will be described later) of the semiconductor stacked portion 20 in a view seen in a direction crossing the front surface 10a, and a junction with the first electrode 40 is formed in the first portion 31. The buffer layer 30 includes, for example, InP. For example, the buffer layer 30 is formed of N$^+$—InP.

The semiconductor stacked portion 20 includes buffer layers 21, 22, and 23, a light absorption layer 24, a cap layer 25, and a contact layer 26 which are stacked on the buffer layer 30 sequentially from the substrate 10 side. The buffer layers 21 and 22 have a first conductivity type (for example, an N$^+$ type). The buffer layer 23 has the first conductivity type (for example, an N$^-$ type). The buffer layers 21, 22, and 23 include InAsP. For example, the buffer layer 21 is formed of N$^+$—InAs$_{0.05}$P, the buffer layer 22 is formed of N$^+$—InAs$_{0.10}$P, and the buffer layer 23 is formed of N$^-$—InAs$_{0.15}$P (or N$^-$—InGaAsP).

Accordingly, the buffer layers 21, 22, and 23 serve as strain relaxation layers having a lattice constant between a lattice constant of the substrate 10 and a lattice constant of the light absorption layer 24. That is, the semiconductor stacked portion 20 includes a plurality of strain relaxation layers (step layers) which are disposed such that the lattice constant becomes close to the lattice constant of the light absorption layer 24 in a stepwise manner from the substrate 10 to the light absorption layer 24.

The buffer layer 23 is disposed closer to the light absorption layer 24 than the buffer layers 21 and 22 and has an impurity concentration lower than an impurity concentration of the buffer layers 21 and 22. Accordingly, the semiconductor stacked portion 20 includes a first semiconductor layer (the buffer layer 21 or the buffer layer 22) disposed between the substrate 10 and the light absorption layer 24 and a second semiconductor layer (the buffer layer 23) having an impurity concentration lower than an impurity concentration of the first semiconductor layer and disposed between the first semiconductor layer and the light absorption layer 24.

The light absorption layer 24 has the first conductivity type (for example, an N$^-$ type). The light absorption layer 24 includes InGaAs. Here, the light absorption layer 24 is formed of N$^-$—In$_x$Ga$_{1-x}$As. An In content x of the light absorption layer 24 is equal to or greater than 0.55 (and less than 1). For example, the In content x is 0.59 herein. A thickness of the light absorption layer 24 (a thickness in a stacking direction of the semiconductor stacked portion 20) is equal to or less than 1.8 μm and is, for example, 0.7 μm herein. The light absorption layer 24 may be an absorption layer of mixed crystals of Al, P, Sb, N, and other materials and InGaAs in a band gap range equal to or less than eV. Proportions of Al, P, Sb, and N (or other materials) which are mixed into InGaAs may be set, for example, to 5% or less or 10% or less.

The cap layer 25 has the first conductivity type (for example, an N$^-$ type). The cap layer 25 includes InGaP. For example, the cap layer 25 is formed of N$^-$—InAs$_{0.15}$P herein. The contact layer 26 has the first conductivity type (for example, an N$^-$ type). The contact layer 26 includes InGaAs. For example, the contact layer 26 is formed of N$^-$—InGaAs herein.

A semiconductor region (a second region) 27 of a second conductivity type (a P$^+$ type herein) is formed in the semiconductor stacked portion 20. The semiconductor region 27 can be formed, for example, by impurity diffusion or ion implantation. The semiconductor region 27 extends from a top surface 20a of the semiconductor stacked portion 20 to the substrate 10. Here, the top surface 20a (a surface opposite to the substrate 10 side) of the semiconductor stacked portion 20 is a surface of the contact layer 26. The P$^+$ type semiconductor region 27 is formed to extend from the contact layer 26 to the light absorption layer 24 via the cap layer 25.

Here, the semiconductor region 27 is also formed in the light absorption layer 24. In an example in which the thickness of the light absorption layer 24 is 0.7 μm, an area of about 0.2 μm on the cap layer 25 side in the light absorption layer 24 is the semiconductor region 27. That is, in this example, an N$^-$ region with a thickness of 0.5 μm and a P$^+$ region with a thickness of 0.2 μm are included in the light absorption layer 24, and a boundary therebetween is formed therein. A termination of the P$^+$ region is, for example, a position at which the P-type impurity concentration is equal to or less than $1 \times 10^{17}$/cm$^3$. The boundary between the N$^-$ region and the P$^+$ region may be formed outside of the light absorption layer 24.

In the aforementioned example, the N$^+$ type means that the N-type impurity concentration is equal to or greater than about $1 \times 10^{17}$/cm$^3$. The N$^-$ type means that the N-type impurity concentration is equal to or lower than about $8 \times 10^{15}$/cm$^3$ and is lower than that of the N$^+$ type. The P$^+$ type means that the P-type impurity concentration is equal to or greater than about $1 \times 10^{17}$/cm$^3$.

Here, the semiconductor light receiving element 1 includes a passivation film 60. The passivation film 60 is, for example, an insulating film. A part of the top surface 20a of the semiconductor stacked portion 20 and a side surface 20s of the semiconductor stacked portion 20 extending from a circumferential edge of the top surface 20a to the substrate 10 side are covered with the passivation film 60. On the other hand, the remaining part of the top surface 20a of the semiconductor stacked portion 20, that is, the surface of the P$^+$-type semiconductor region 27, is exposed from the passivation film 60. The second electrode 50 is formed in the part of the top surface 20*a* exposed from the passivation film 60, and a junction between the second electrode 50 and the semiconductor region 27 (the contact layer 26) is formed. That is, the second electrode 50 is connected to a second portion of the second conductivity type (the semiconductor region 27) located on the opposite side to the substrate 10 with respect to the light absorption layer 24 in the semiconductor stacked portion 20. On the other hand, the first electrode 40 is connected to a first portion 31 of the first conductivity type (a part exposed from the passivation film 60 in the buffer layer 30) located on the substrate 10 side with respect to the light absorption layer 24 in the semiconductor stacked portion 20.

Figure 4:
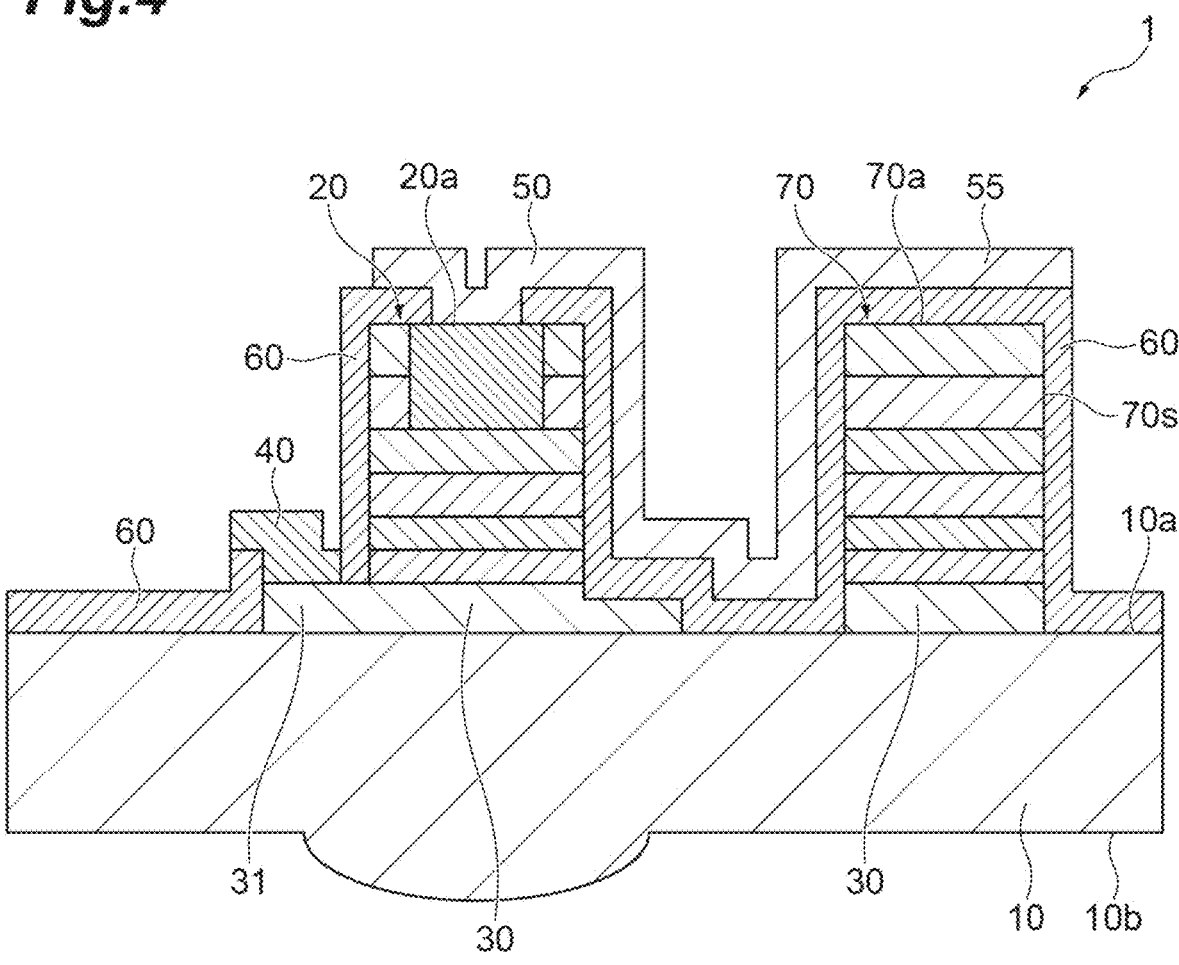
FIG. 4 is a sectional view taken along line IV-IV in FIG. 2.

FIG. 4 is a sectional view taken along line IV-IV in FIG. 2. As illustrated in FIGS. 2 and 4, a semiconductor stacked portion 70 is formed on the front surface 10*a* of the substrate 10 with the buffer layer 30 interposed therebetween. The structure of the semiconductor stacked portion 70 is the same as the structure of the semiconductor stacked portion 20 other than the buffer layer 30 except that the P$^+$-type semiconductor region 27 is not formed. The semiconductor stacked portion 70 is covered with the passivation film 60 as a whole.

Here, the second electrode 50 extends from the top surface 20*a* of the semiconductor stacked portion 20 to a top surface 70*a* of the semiconductor stacked portion 70 (a surface on the opposite side to the substrate 10) and forms an anode pad 55 on the top surface 70*a*. That is, the anode pad 55 electrically connected to the second electrode 50 is formed on the top surface 70*a* of the semiconductor stacked portion 70 with the passivation film 60 interposed therebetween.

Figure 5:
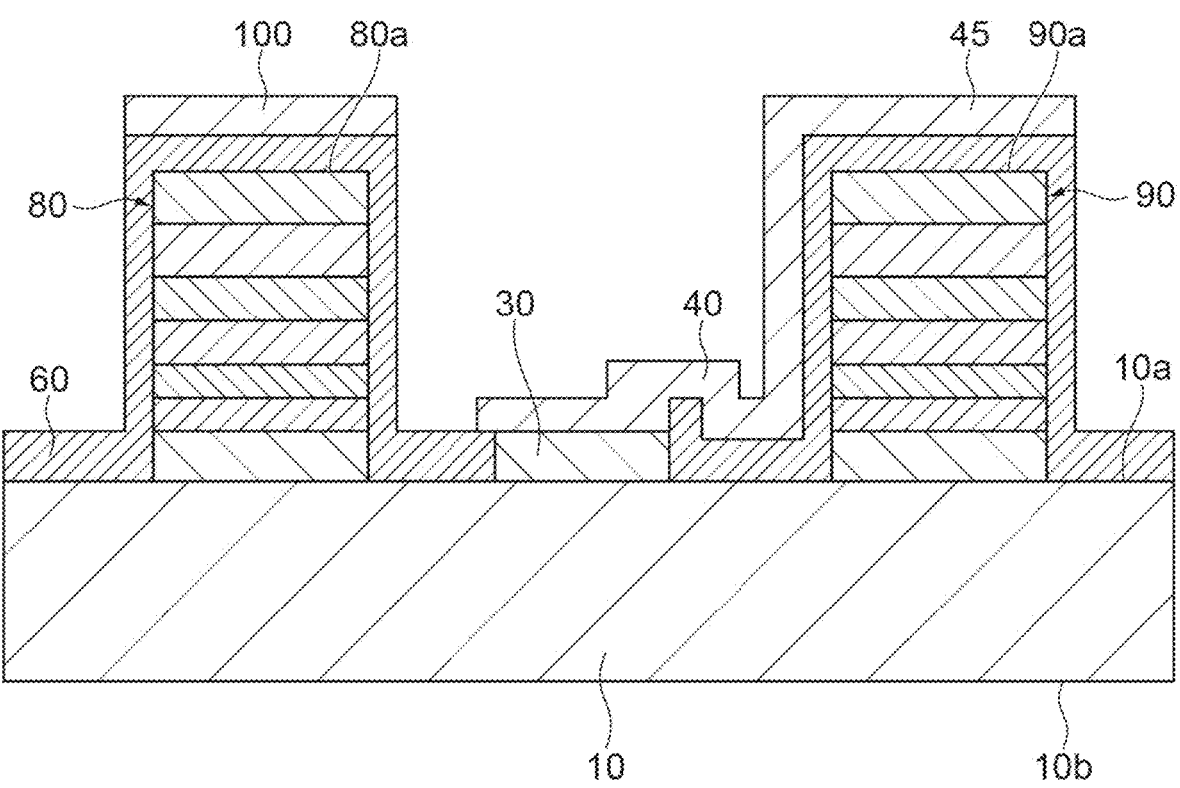
FIG. 5 is a sectional view taken along line V-V in FIG. 2.

FIG. 5 is a sectional view taken along line V-V in FIG. 2. As illustrated in FIGS. 2 and 5, semiconductor stacked portions 80 and 90 are formed on the front surface 10*a* of the substrate 10 with the buffer layer 30 interposed therebetween. The structures of the semiconductor stacked portions 80 and 90 are the same as the structure of the semiconductor stacked portion 20 other than the buffer layer 30 except that the P+-type semiconductor region 27 is not formed. The semiconductor stacked portions 80 and 90 are covered with the passivation film 60 as a whole. Here, the first electrode 40 extends from a part bonded to the buffer layer 30 to a top surface 90*a* of the semiconductor stacked portion 90 (a surface on the opposite side to the substrate 10) and forms a cathode pad 45 on the top surface 90*a*.

That is, the cathode pad 45 electrically connected to the first electrode 40 is formed on the top surface 90*a* of the semiconductor stacked portion 90 with the passivation film 60 interposed therebetween. On the other hand, a dummy pad 100 is formed on a top surface 80*a* of the semiconductor stacked portion 80 with the passivation film 60 interposed therebetween. As illustrated in FIG. 2, the cathode pad 45 (and the semiconductor stacked portion 90) is formed as a pair with the anode pad 55 (and the semiconductor stacked portion 70) interposed therebetween, and a pair of dummy pads 100 (and the semiconductor stacked portion 80) is also formed.

In the optical device A, the semiconductor light receiving element 1 is disposed such that the front surface 10*a* of the substrate 10 faces the sub-mount A1, that is, such that the rear surface 10*b* of the substrate 10 faces the opposite side to the sub-mount A1, and is mounted on the sub-mount A1. Accordingly, a pair of cathode pads 45, the anode pad 55, and a pair of dummy pads 100 are connected to the electrode pads provided on the sub-mount A1. As a result, the cathode pad 45 and the anode pad 55 are connected to electrodes which are electrically connected to the trans-impedance amplifier A5 on the sub-mount A1.

Figure 6:
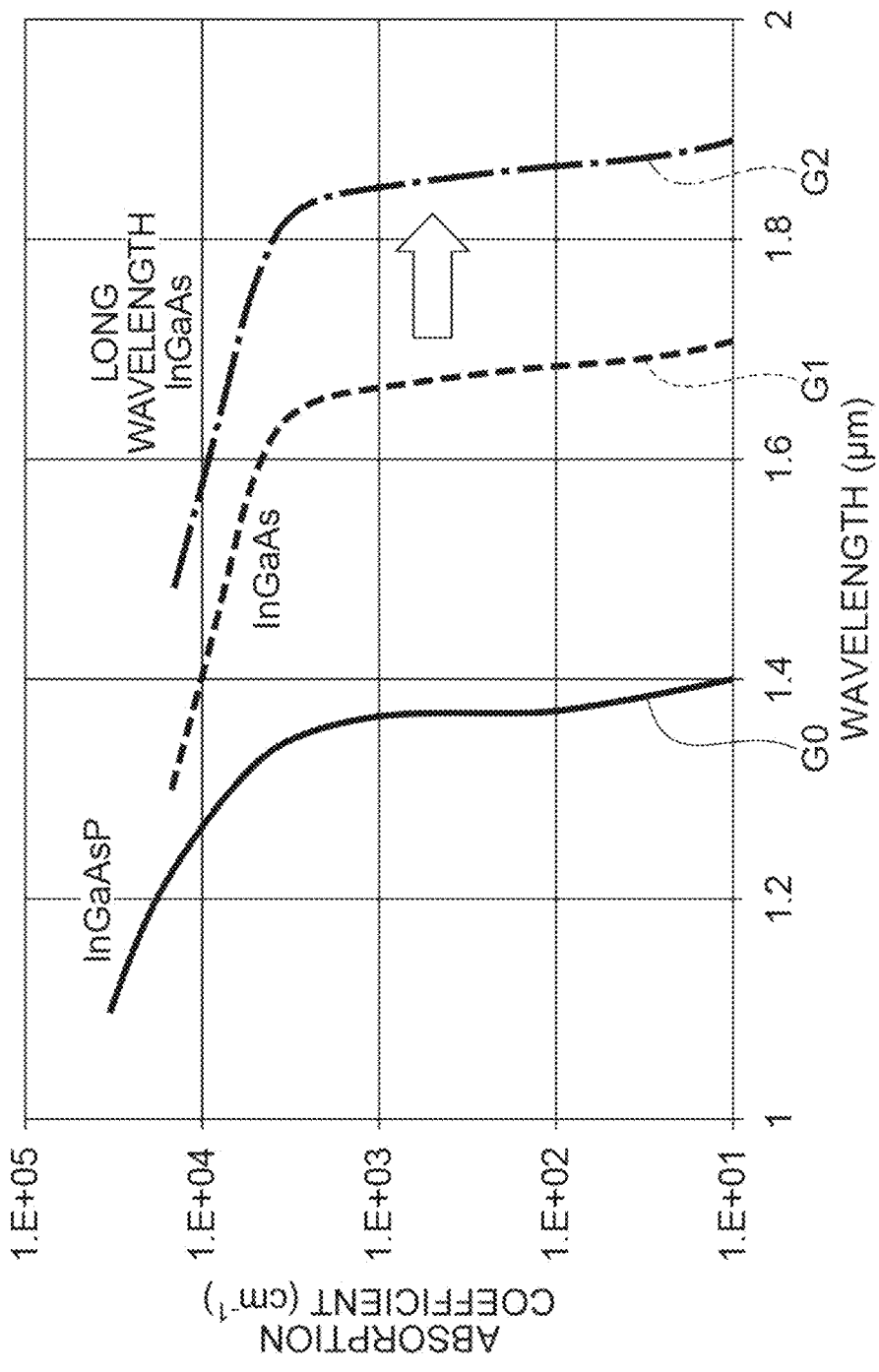
FIG. 6 is a graph illustrating a relationship between a composition of a light absorption layer and an absorption coefficient.

As described above, the semiconductor light receiving element 1 handles light in wavelength bands for optical communication such as 1.3 μm band, 1.55 μm band, and 1.6 μm band. In the semiconductor light receiving element 1, the light absorption layer 24 provided on the substrate 10 of a semi-insulated semiconductor includes $In_xGa_{1-x}As$. The In content x of the light absorption layer 24 is equal to or less than (and less than 1). In this way, when the In content x of $In_xGa_{1-x}As$ in the light absorption layer 24 is set to be equal to or greater than 0.55 (Graph G2 in FIG. 6), the absorption coefficient is improved (improved to two times that in the 1.55 μm band in the example illustrated in FIG. 6), for example, in comparison with the case in which the In content x in Graph G1 illustrated in FIG. 6 is 0.53. Graph G0 in FIG. 6 indicates a case in which a light absorption layer formed of InGaAsP is used.

Accordingly, it is possible to curb a decrease in sensitivity even when the thickness of the light absorption layer 24 is decreased to be equal to or less than 1.8 μm. That is, it is possible to achieve an increase in speed. In the semiconductor light receiving element 1, a particular structure (for example, the slope reflecting portion of the photodiode described in Patent Literature 1) does not need to be formed for the purpose of achievement an increase in speed. With the semiconductor light receiving element 1, it is possible to curb an increase in cost and to achieve an increase in speed. In view of an increase in speed, the semiconductor light receiving element 1 may be configured such that an optical path oblique with respect to the thickness direction of the light absorption layer 24 is formed in the light absorption layer 24.

As indicated by Graphs G1 and G2 in FIG. 6, an absorption end increases in wavelength by increasing the In content x of the light absorption layer 24. However, the semiconductor light receiving element 1 is characterized in that an absorption coefficient in the target wavelength band (the 1.3 μm band, the 1.55 μm band, and the 1.6 μm band for optical communication) is improved, not in that the absorption end increases in wavelength. That is, with the semiconductor light receiving element 1, it is possible to achieve a decrease in thickness of the light absorption layer 24 and a high-speed operation by improving the absorption coefficient in the target wavelength band. In other words, in the semiconductor light receiving element 1, it is important to combine the target wavelength band and requirements of the In content x and the thickness of the light absorption layer 24. In addition, as the thickness of the light absorption layer 24 decreases, an influence of the absorption coefficient on a light sensitivity become more remarkable and thus the configuration for making a restraint response and a high light sensitivity compatible as in the semiconductor light receiving element 1 becomes more effective.

On the other hand, when the In content x of the light absorption layer 24 is changed (increased), a difference between the lattice constant of the light absorption layer 24 and the lattice constant of the substrate 10 is likely to increase and there is concern about crystallinity deterioration when the light absorption layer 24 grows on the substrate 10.

Therefore, in the semiconductor light receiving element 1, the semiconductor stacked portion 20 includes the buffer layers 21 to 23 serving as strain relaxation layers having a lattice constant between the lattice constant of the substrate 10 and the lattice constant of the light absorption layer 24.

Accordingly, it is possible to improve the crystallinity of the semiconductor stacked portion 20 including the light absorption layer 24. Particularly, in the semiconductor light receiving element 1, the buffer layers 21 to 23 serve as a plurality of strain relaxation layers which are disposed such that the lattice constant becomes close the lattice constant of the light absorption layer 24 in a stepwise manner from the substrate 10 to the light absorption layer 24. Accordingly, it is possible to reliably improve the crystallinity of the semiconductor stacked portion 20.

In the semiconductor light receiving element 1, the semiconductor stacked portion 20 includes the cap layer 25 of the first conductivity type provided on the light absorption layer 24 on the opposite side to the substrate 10 with respect to the light absorption layer 24 and including InAsP and the contact layer 26 of the first conductivity type provided on the cap layer 25 on the opposite side to the substrate 10 with respect to the light absorption layer 24 and including InGaAs, and the semiconductor region 27 of the second conductivity type is formed from the contact layer 26 to the light absorption layer 24 via the cap layer 25. The part connected to the second electrode 50 is the surface of the semiconductor region 27 formed in the contact layer 26. Accordingly, it is possible to decrease the contact resistance of the second electrode 50.

In the semiconductor light receiving element 1, the semiconductor stacked portion 20 includes the first semiconductor layer (the buffer layer 21 or the buffer layer 22) of the first conductivity type disposed between the substrate 10 and the light absorption layer 24 and the second semiconductor layer of the first conductivity type (the buffer layer 23) with an impurity concentration lower than the impurity concentration of the first semiconductor layer disposed between the first semiconductor layer and the light absorption layer 24. Accordingly, it is possible to achieve a further increase in speed due to a decrease in capacitance.

In the semiconductor light receiving element 1, the substrate 10 includes a semi-insulated semiconductor. When a conductive substrate is used as the substrate 10, the substrate and the semiconductor stacked portion 20 are electrically connected and thus have the same potential. In this case, capacitive coupling between an anode and a cathode is performed even via the passivation film 60 (an insulating film) and thus a decrease in capacitance cannot be expected. On the other hand, in the semiconductor light receiving element 1, electrical isolation is possible by performing etching or the like of a grown layer to be the semiconductor stacked portion 20 up to the semi-insulated or insulated substrate 10. As a result, it is possible to prevent capacitive coupling and achieve a decrease in capacitance. The substrate 10 can be semi-insulated, for example, by doping InP, GaAs, or the like with Fe or the like. Since the lattice constant of InP matches the lattice constant of InGaAs, an InGaAs layer with good crystallinity can grow directly on the semi-insulated substrate 10.

The aforementioned embodiment is for describing an aspect of the present disclosure. Accordingly, the present disclosure is not limited to the aforementioned aspect and can be arbitrarily modified. Modified examples will be described below.

Figure 7:
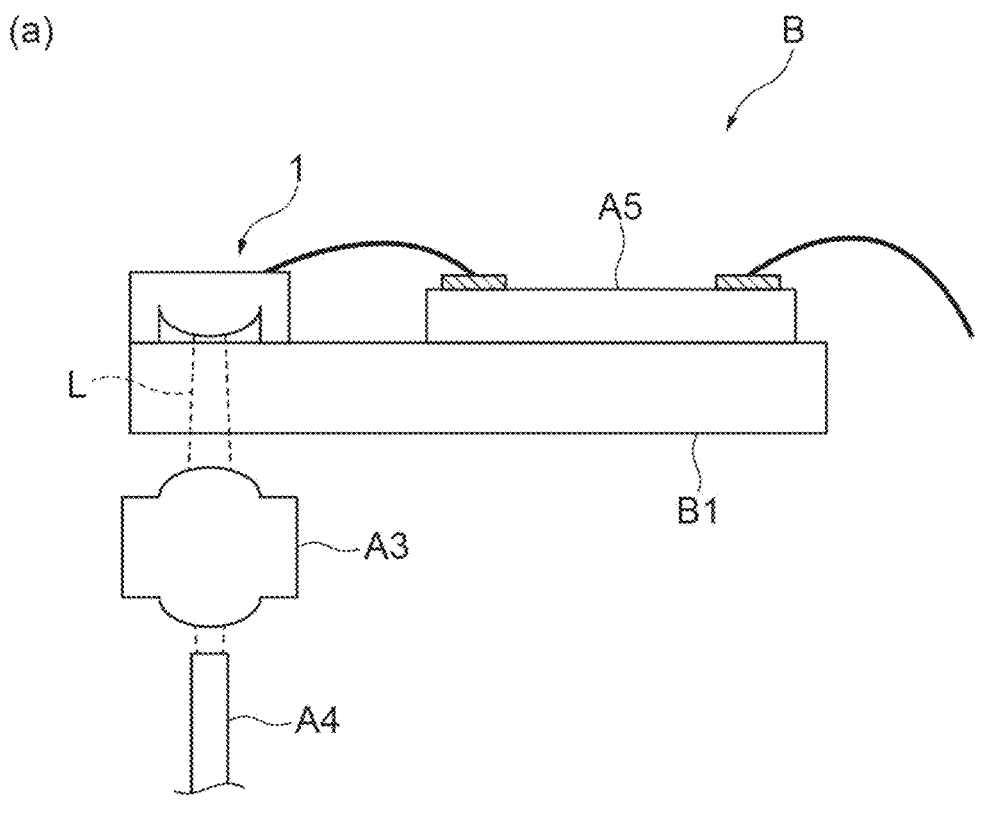
FIG. 7 is a schematic side view illustrating a configuration of an optical device according to a modified example.
Figure 7:
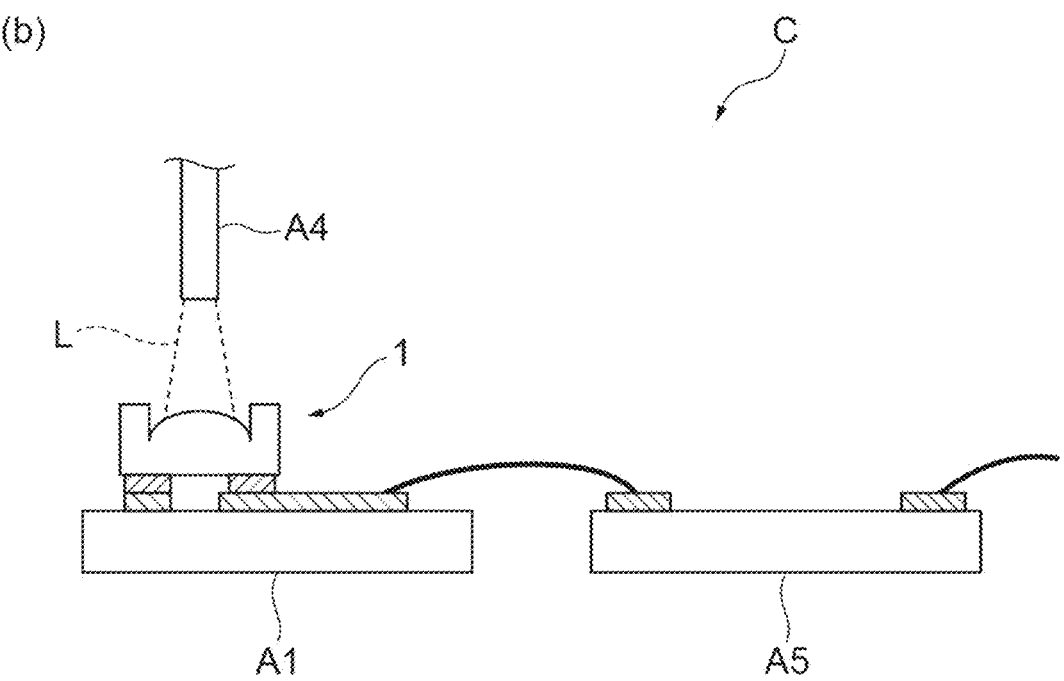

FIG. 7 is a diagram illustrating a modified example of a method of mounting a semiconductor light receiving element. In an optical device B illustrated in (a) of FIG. 7, the semiconductor light receiving element 1 is mounted on a glass substrate B1 such that the rear surface 10*b* of the substrate 10 faces the glass substrate B1 and is directly electrically connected to the trans-impedance amplifier A5 mounted on the glass substrate B1 in the same way by a wire. The lens A3 and the optical fiber A4 are disposed on a surface of the glass substrate B1 opposite to the surface on which the semiconductor light receiving element 1 is mounted, and light L is incident on the semiconductor light receiving element 1 from the rear surface 10*b* via the glass substrate B1. In an optical device C illustrated in (b) of FIG. 7, the lens A3 is omitted in comparison with the optical device A illustrated in FIG. 1. The semiconductor light receiving element 1 may be directly mounted on the trans-impedance amplifier A5.

In this way, the method of mounting the semiconductor light receiving element 1 and the optical device including the semiconductor light receiving element 1 can be considered as various aspects. In the aforementioned examples, the semiconductor light receiving element 1 is used as a rear surface incidence type. However, the semiconductor light receiving element 1 may be configured as a front surface incidence type. In this case, an opening can be formed such that a light receiving portion is exposed from the second electrode 50 provided on the light receiving portion (the semiconductor region 27).

In the aforementioned examples, the thickness of the light absorption layer 24 is 0.7 μm and the In content x of the light absorption layer 24 is 0.59. However, the thickness of the light absorption layer 24 can be equal to or less than 1.8 μm and the In content x can be equal to or greater than 0.55. Particularly, the In content x of the light absorption layer 24 may be equal to or greater than 0.57 and the thickness of the light absorption layer 24 may be equal to or less than 1.2 μm. The In content x of the light absorption layer 24 may be equal to or greater than 0.59 and the thickness of the light absorption layer 24 may be equal to or less than 0.7 μm. In this case, it is possible to achieve an increase in speed by further decreasing the thickness of the light absorption layer.

Examples of the combination of the wavelength bands, the thickness of the light absorption layer 24, and the In content x of the light absorption layer 24 will be described below. For example, Combination (5) or the like is not limited to the C-band and can be similarly applied to the O-band and the L-band.

(1) C-band

Sensitivity: 0.86 A/W or more

Cutoff frequency: 20 GHz or more (in case of 28 GB or the like) Absorption layer thickness: 1.5 μm (items: N⁻ region of 1.3 μm, P⁺ region of 0.2 μm)

In content x: x=0.55

(2) C-band

Sensitivity: 0.90 A/W or more

Cutoff frequency: 20 GHz or more (in case of high-sensitivity product of 28 GB)

Absorption layer thickness: 1.5 μm (items: N⁻ region of 1.3 μm, P⁺ region of 0.2 μm)

In content x: x=0.57

(3) C-band

Sensitivity: 0.80 A/W or more

Cutoff frequency: 30 GHz or more (in case of 56 GB or the like)

Absorption layer thickness: 1.2 μm (items: N⁻ region of 1.0 μm, P⁺ region of 0.2 μm)

In content x: x=0.57

(4) C-band

Sensitivity: 0.85 A/W or more

Cutoff frequency: 30 GHz or more (in case of high-sensitivity product of 56 GB)

Absorption layer thickness: 1.2 μm (items: N⁻ region of 1.0 μm, P⁺ region of 0.2 μm)

In content x: x=0.59
(5) C-band
  Sensitivity: 0.7 A/W or more
  Cutoff frequency: 45 GHz or more (in case of 96 GB or the like)
  Absorption layer thickness: 0.7 μm (items: N⁻ region of 0.5 μm, P⁺ region of 0.2 μm)
  In content x: x=0.59
(6) C-band
  Sensitivity: 0.90 A/W or more
  Cutoff frequency: 16 GHz or more (in case of 25 GB or the like)
  Absorption layer thickness: 1.8 μm (items: N⁻ region of 1.6 μm, P⁺ region of 0.2 μm)
  In content x: x=0.55
(7) C-band
  Sensitivity: 0.93 A/W or more
  Cutoff frequency: 16 GHz or more (in case of 25 GB or the like)
  Absorption layer thickness: 1.8 μm (items: N⁻ region of 1.6 μm, P⁺ region of 0.2 μm)
  In content x: x=0.57

In the semiconductor light receiving element 1, the semiconductor stacked portion 20 may include a third semiconductor layer disposed between the light absorption layer 24 and the cap layer 25 and having a band gap between the band gap of the light absorption layer 24 and the band gap of the cap layer 25. The third semiconductor layer has the first conductivity type (for example, the N⁻ type) and is formed of, for example, N⁻—InAsGaP. In this case, it is possible to curb difficulty in taking out carriers which is due to rapidly changing the band gap between the cap layer 25 and the light absorption layer 24.

In the semiconductor light receiving element 1, at least one layer of the buffer layers 21 to 23 and 30 may be semi-insulated by being doped with Fe and may be increased in thickness. In this case, it is possible to improve the crystallinity.

The buffer layers 21 to 23 and 30 are not limited to InAsP and may include InGaAsP for the purpose of an increase of the band gap to improve transmittance in a 1.3 μm band, a 1.55 μm band, and a 1.6 μm band (may be formed of InGaAsP). The layers of the semiconductor stacked portion 20 may include another element such as Al.

In the semiconductor light receiving element 1, the buffer layers 21 to 23 in which the lattice constant changes in a stepwise manner from the substrate 10 to the light absorption layer 24 is used, but a strain relaxation layer (a buffer layer) in which the lattice constant changes continuously to approach the lattice constant of the light absorption layer 24 from the substrate 10 to the light absorption layer 24 may be used. In the aforementioned examples, the semiconductor light receiving element 1 includes the cap layer 25 and the contact layer 26 sequentially stacked on the light absorption layer 24, and the second electrode 50 is connected to the surface of the semiconductor region 27 formed in the contact layer 26. However, in the semiconductor light receiving element 1, the cap layer 25 may be omitted and the contact layer 26 may be formed directly in the light absorption layer 24. In this case, it is possible to decrease the contact resistance of the second electrode 50.

In view of an increase in speed, the light absorption layer 24 may be applied to a waveguide type semiconductor light receiving element. In the waveguide type semiconductor light receiving element, a ridge waveguide is formed on a semi-insulated InP substrate, and a light receiving portion including the light absorption layer 24 is formed in the ridge waveguide. In this case, by employing the light absorption layer 24 with improved absorbance for the waveguide type, it is possible to decrease capacitance by decreasing a length of a light receiving surface in an extending direction of the waveguide. It is possible to improve responsiveness by increasing a moving speed of electrons even in the same thickness.

In the semiconductor light receiving element 1, the substrate 10 may be removed, for example, by etching or grinding and the semiconductor stacked portion 20 may be bonded to the substrate formed of an insulator such as quartz or a material such as a semi-insulated semiconductor (for example, gallium arsenide) other than InP. In other words, in the semiconductor light receiving element 1, the substrate 10 includes an insulator or a semi-insulated semiconductor and is formed as a member separate from the semiconductor stacked portion 20, and the semiconductor stacked portion 20 may be bonded (for example, directly) to the substrate 10. In this way, by separately forming and bonding the substrate 10 and the semiconductor stacked portion 20 to manufacture the semiconductor light receiving element 1, it is possible to achieve an increase in diameter and curb an increase in cost by forming optical components out of cheap materials.

When the substrate 10 and the semiconductor stacked portion 20 which are separately formed are bonded, direct bonding or bonding using a resin can be employed. When a resin is used for bonding the substrate 10 and the semiconductor stacked portion 20, there is a likelihood that light in a target wavelength band will be absorbed depending on characteristics of the resin, but the likelihood decreases to zero using the direct bonding.

The semiconductor light receiving element according to the present disclosure receives incidence of light in at least one wavelength band of a 1.3 μm band, a 1.55 μm band, and a 1.6 μm band and generates an electrical signal according to the incident light. The semiconductor light receiving element includes a substrate, a semiconductor stacked portion formed on a first region of the substrate, and a first electrode and a second electrode electrically connected to the semiconductor stacked portion. The semiconductor stacked portion includes a light absorption layer of a first conductivity type including $In_xGa_{1-x}As$, a buffer layer of the first conductivity type disposed between the substrate and the light absorption layer, and a second region of a second conductivity type other than the first conductivity type that is located on the opposite side to the substrate with respect to the light absorption layer and bonded to the light absorption layer. The first electrode is connected to a first portion of the first conductivity type located on the substrate side with respect to the light absorption layer in the semiconductor stacked portion, and the second electrode is connected to a second portion of the second conductivity type located on the opposite side to the substrate with respect to the light absorption layer in the semiconductor stacked portion. An In content x in the light absorption layer is equal to or greater than 0.55, and a thickness of the light absorption layer is equal to or less than 1.5 μm.

INDUSTRIAL APPLICABILITY

It is possible to provide a semiconductor light receiving element that can curb an increase in cost and achieve an increase in speed.

REFERENCE SIGNS LIST

1 Semiconductor light receiving element
20 Semiconductor stacked portion

21, 22 Buffer layer (strain relaxation layer, first semiconductor layer)

23 Buffer layer (strain relaxation layer, second semiconductor layer)

24 Light absorption layer

25 Cap layer

26 Contact layer

27 Semiconductor region (second portion)

31 First portion

40 First electrode

50 Second electrode

The invention claimed is:

1. A semiconductor light receiving element configured to receive incidence of light in at least one wavelength band of a 1.3 μm band, a 1.55 μm band, and a 1.6 μm band and configured to generate an electrical signal according to incident light, the semiconductor light receiving element comprising:

a substrate;

a semiconductor stacked portion formed on a first region of the substrate; and a first electrode and a second electrode electrically connected to the semiconductor stacked portion, wherein the semiconductor stacked portion includes:

a light absorption layer includes a first conductivity type region of a first conductivity type including $In_xGa_{1-x}As$;

a buffer layer of the first conductivity type disposed between the substrate and the light absorption layer; and a second region of a second conductivity type other than the first conductivity type, which is formed inside of the light absorption layer from a position on a side of the first conductivity type region opposite to the substrate, wherein the first electrode is connected to a first portion of the first conductivity type located on the substrate side with respect to the light absorption layer in the semiconductor stacked portion, wherein the second electrode is connected to a second portion of the second conductivity type located on the opposite side to the substrate with respect to the light absorption layer in the semiconductor stacked portion, wherein an In content x in the light absorption layer is equal to or greater than 0.55, wherein a thickness of the light absorption layer is equal to or less than 1.8 μm, wherein the substrate includes a front surface on which the semiconductor stacked portion is formed and a rear surface opposite to the front surface, wherein the semiconductor stacked portion includes a top surface on a side opposite to the substrate, and wherein the semiconductor light receiving element is a rear surface incident type that receives light incident from the rear surface, or a front surface incident type that receives light incident from the top surface.

2. The semiconductor light receiving element according to claim 1, wherein the buffer layer includes a strain relaxation layer having a lattice constant between a lattice constant of the substrate and a lattice constant of the light absorption layer.

3. The semiconductor light receiving element according to claim 2, wherein the buffer layer includes a plurality of strain relaxation layers that are disposed such that the lattice constant becomes close to the lattice constant of the light absorption layer in a stepwise manner from the substrate to the light absorption layer.

4. The semiconductor light receiving element according to claim 2, wherein the buffer layer includes the strain relaxation layer in which the lattice constant changes continuously to become close to the lattice constant of the light absorption layer from the substrate to the light absorption layer.

5. The semiconductor light receiving element according to claim 1, wherein the semiconductor stacked portion includes:

a cap layer of the first conductivity type that is provided on the light absorption layer on the opposite side to the substrate with respect to the light absorption layer and includes InAsP; and a contact layer of the first conductivity type that is provided on the cap layer on the opposite side to the substrate with respect to the light absorption layer and includes InGaAs, wherein the second region is formed from the contact layer to the light absorption layer via the cap layer, and wherein the second portion to which the second electrode is connected is a surface of the second region formed in the contact layer.

6. The semiconductor light receiving element according to claim 1, wherein the semiconductor stacked portion includes:

a first semiconductor layer of the first conductivity type disposed between the substrate and the light absorption layer; and a second semiconductor layer of the first conductivity type including an impurity concentration lower than an impurity concentration of the first semiconductor layer and disposed between the first semiconductor layer and the light absorption layer.

7. The semiconductor light receiving element according to claim 5, wherein the semiconductor stacked portion includes a third semiconductor layer disposed between the light absorption layer and the cap layer and having a band gap between a band gap of the light absorption layer and a band gap of the cap layer.

8. The semiconductor light receiving element according to claim 1, wherein at least one layer of the buffer layer is semi-insulated by being doped with Fe.

9. The semiconductor light receiving element according to claim 1, wherein the In content x in the light absorption layer is equal to or greater than 0.57, and wherein the thickness of the light absorption layer is equal to or less than 1.2 μm.

10. The semiconductor light receiving element according to claim 1, wherein the In content x in the light absorption layer is equal to or greater than 0.59, and wherein the thickness of the light absorption layer is equal to or less than 0.7 μm.

11. The semiconductor light receiving element according to claim 1, wherein the substrate includes a semi-insulated semiconductor.

12. The semiconductor light receiving element according to claim 1, wherein the substrate includes an insulator or a semi-insulated semiconductor, and wherein the semiconductor stacked portion is bonded to the substrate.

13. The semiconductor light receiving element according to claim 1, wherein the light absorption layer consists of one semiconductor layer including InGaAs.

14. The semiconductor light receiving element according to claim 1, wherein the second region is formed to inside of the light absorption layer, and wherein a thickness of a region of the first conductivity type in the light absorption layer is equal to or greater than 0.5 µm.

15. A semiconductor light receiving element configured to receive incidence of light in at least one wavelength band of a 1.3 µm band, a 1.55 µm band, and a 1.6 µm band and configured to generate an electrical signal according to incident light, the semiconductor light receiving element comprising:

a substrate;

a semiconductor stacked portion formed on a first region of the substrate; and a first electrode and a second electrode electrically connected to the semiconductor stacked portion, wherein the semiconductor stacked portion includes:

a light absorption layer includes a first conductivity type region of a first conductivity type including $In_xGa_{1-x}As$;

a buffer layer of the first conductivity type disposed between the substrate and the light absorption layer; and a second region of a second conductivity type other than the first conductivity type, which is on a side of the first conductivity type region opposite to the substrate and in contact with the first conductivity type region, wherein the first electrode is connected to a first portion of the first conductivity type located on the substrate side with respect to the light absorption layer in the semiconductor stacked portion, wherein the second electrode is connected to a second portion of the second conductivity type located on the opposite side to the substrate with respect to the light absorption layer in the semiconductor stacked portion, wherein an In content x in the light absorption layer is equal to or greater than 0.55, wherein a thickness of the light absorption layer is equal to or less than 1.8 µm, wherein the substrate includes a front surface on which the semiconductor stacked portion is formed and a rear surface opposite to the front surface, wherein the semiconductor stacked portion includes a top surface on a side opposite to the substrate, wherein the semiconductor light receiving element is a rear surface incident type that receives light incident from the rear surface, or a front surface incident type that receives light incident from the top surface, and wherein the semiconductor light receiving element comprises the only one light absorption layer, and wherein the light absorption layer includes one layer of the first conductivity type containing $In_xGa_{1-x}As$.

* * * * *